(12) United States Patent
Morris et al.

(10) Patent No.: US 12,009,740 B2
(45) Date of Patent: Jun. 11, 2024

(54) POWER CONVERSION SYSTEM WITH ENHANCED PROTECTION FOR GASEOUS CORROSIVE ATMOSPHERES

(71) Applicant: ROCKWELL AUTOMATION TECHNOLOGIES, INC., Mayfield Heights, OH (US)

(72) Inventors: Garron Morris, Whitefish Bay, WI (US); Garrett Wolff, Sussex, WI (US); Craig Devroy, New Berlin, WI (US); James Carter, Wauwatosa, WI (US); Christopher Genthe, West Bend, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 18/303,259

(22) Filed: Apr. 19, 2023

(65) Prior Publication Data
US 2024/0136913 A1    Apr. 25, 2024

Related U.S. Application Data

(63) Continuation of application No. 17/020,738, filed on Sep. 14, 2020, now Pat. No. 11,784,554.

(51) Int. Cl.
*H02M 1/32*     (2007.01)
*H01L 23/00*    (2006.01)
(Continued)

(52) U.S. Cl.
CPC ............ *H02M 1/32* (2013.01); *H01L 23/564* (2013.01); *H02M 7/217* (2013.01); *H05K 5/0095* (2013.01)

(58) Field of Classification Search
CPC .......... H02M 1/32; H02M 7/217; H01L 23/54; H05K 5/0095
See application file for complete search history.

(56) References Cited

U.S. PATENT DOCUMENTS

2010/0182809 A1* 7/2010 Cullinane ................ H02P 9/02
                                                    363/34
2011/0269029 A1* 11/2011 Gellett .............. H01M 8/04089
                                                    429/401
(Continued)

FOREIGN PATENT DOCUMENTS

CN        103268995 A     8/2013
CN        208539226 U     2/2019
(Continued)

OTHER PUBLICATIONS

Anonymous: "What Are Conformal Coatings? Everything you need to know", Nov. 4, 2016 (Nov. 4, 2016), XP093087211, Retrieved from the Internet: URL:https://electrolube.com/knowledge_base/what-are-conformal-coatings/ [retrieved on Sep. 29, 2023], 6 pages.
(Continued)

*Primary Examiner* — Rafael O De Leon Domenech

(57) ABSTRACT

A motor drive or bus supply power conversion system includes a rectifier with at least one rectifier switch module for rectifying AC input power. A DC bus is connected to the rectifier and supplies DC output power. An optional inverter is connected to the DC bus and includes at least one inverter switch module for inverting the DC bus voltage to an AC output power. The at least one rectifier switch module and the at least one inverter switch module each include a base plate and a housing connected to the base plate. The housing defines an interior space that contains at least one semiconductor switch. Anti-corrosion features are provided including a conformal coating on printed circuit board assemblies, removable connector covers, dielectric grease coated con-
(Continued)

nections, nano-coated fiber optic transceivers, and an exterior protective film wrap.

20 Claims, 8 Drawing Sheets

(51) Int. Cl.
*H02M 7/217* (2006.01)
*H05K 5/00* (2006.01)

(56) References Cited

U.S. PATENT DOCUMENTS

2015/0077955 A1   3/2015   Tio
2015/0197642 A1*  7/2015   Boday ............... C09D 7/67
                                                     427/96.4

FOREIGN PATENT DOCUMENTS

| EP | 3422399 A1 | 1/2019 |
| EP | 3667717 A1 | 6/2020 |
| GB | 2500138 B | 3/2014 |
| WO | 2016033248 A1 | 3/2016 |

OTHER PUBLICATIONS

European Patent Office, "Communication pursuant to Rule 62 EPC, Extended European Search Report", application No. 23185179.1 EPO, issued on Oct. 11, 2023 19, 2023, 14 pages.
Notification of the First Office Action issued from the China National Intellectual Property Administration, Chinese Application No. 202110882265.9, 16 pages, dated Feb. 26, 2024 (English translation included).

* cited by examiner

POWER CONVERSION SYSTEM WITH ENHANCED PROTECTION FOR GASEOUS CORROSIVE ATMOSPHERES

CROSS-REFERENCE TO RELATED APPLICATIONS

This application is a continuation of, and claims priority to, U.S. patent application Ser. No. 17/020,738, filed on Sep. 14, 2020, entitled "POWER CONVERSION SYSTEM WITH ENHANCED PROTECTION FOR GASEOUS CORROSIVE ATMOSPHERES" which is incorporated by reference herein in its entirety for all purposes.

BACKGROUND INFORMATION

Power conversion systems such as motor drives and bus supplies for providing electrical power to drive motors and other loads are often used in environments that have a corrosive atmosphere that can be highly detrimental to the internal electronic components. For example, motor drives and bus supplies are often used in harsh environments where they are exposed to corrosive atmospheres including compounds such as sulfur (e.g. particulate sulfur or gaseous compounds such as hydrogen sulfide gas) or chlorine gases. These compounds and others have been found to cause corrosion of exposed metallic surfaces inside the equipment such as exposed metal contacts of electrical connectors. Such corrosion can cause premature and unexpected failure of the motor drive, bus supply, or other equipment which is highly undesirable event. In some cases, the corrosion causes broken or open connections that interrupt critical circuits and in other cases the corrosion can lead to the formation of electrically conductive dendrites that can extend between two contacts or between a contact and an adjacent metal surface such that arcing, fire, short circuits, or other failures occur. In other instances, the corrosion can severely damage an exposed, unused electronic contact or connector to the extent that it is no longer functional as required for future use or to the extent that it causes a short circuit or corrosive damage to related or adjacent components. As such, a need has been found for a motor drive or bus supply power conversion system that includes features for combating the harmful effects of a corrosive atmosphere to provide improved longevity and performance.

BRIEF DESCRIPTION

In accordance with one embodiment of the present development, a power conversion system includes a rectifier with at least one rectifier switch module for rectifying AC input power. A DC bus is connected to the rectifier. An inverter is optionally connected to the DC bus and includes at least one inverter switch module for inverting the DC bus voltage to an AC output power. The at least one rectifier switch module and the at least one inverter switch module each include a base plate and a housing connected to the base plate. The housing defines an interior space that contains at least one semiconductor switch. A protective cover layer includes a corrosion protection material and divides the interior space into an inner sub-space located between the base plate and the protective cover layer and an outer sub-space located between the protective cover layer and the housing. At least one semiconductor switch is located in the inner sub-space such that an atmosphere in the outer sub-space passes through the protective cover layer of corrosion protection material before entering said inner sub-space.

In accordance with another embodiment of the present development, the system includes a printed circuit board assembly including a plurality of electronic components, a plurality of vias, and a plurality of test points. The printed circuit board comprises a conformal coating that covers at least the electronic components, the plurality of vias, and the plurality of test points. Optionally, one or more localized regions of nanocoating are provided on top of the conformal coating for added, multi-layer coating protection of certain components.

In accordance with a further embodiment of the present development, the system includes a plurality of unused connectors, and each of the unused connectors includes a removable connector cover mated therewith to protect metal contacts of the unused connector from contact with a corrosive atmosphere.

In accordance with another aspect of the present development, a system includes a plurality of active connectors that are respectively connected to a corresponding mating connector, wherein each active connector includes one or more metal contacts that are abutted with corresponding metal contacts of the corresponding mating connector. The metal contacts and the corresponding metal contacts are protected from corrosion by a layer of dielectric grease.

According to a further embodiment of the present development, the system comprises a fan that includes a fan printed circuit board assembly including a plurality of fan electronic devices. The fan printed circuit board assembly comprises a conformal coating such as parylene that covers at least said fan electronic devices.

According to another embodiment of the present development, the system comprises a fiber optic transceiver that is coated internally and externally with a protective anti-corrosive nanocoating.

In accordance with another embodiment of the present development, the system includes an enclosure that houses the rectifier and the DC bus, and also the optional inverter if included. The system further comprises a protective film that completely encases the enclosure such that the protective film defines a sealed internal space including the enclosure. The protective film comprises a flexible polymeric substrate and metallic particles contained in said polymeric substrate.

DETAILED DESCRIPTION

Figure 1:
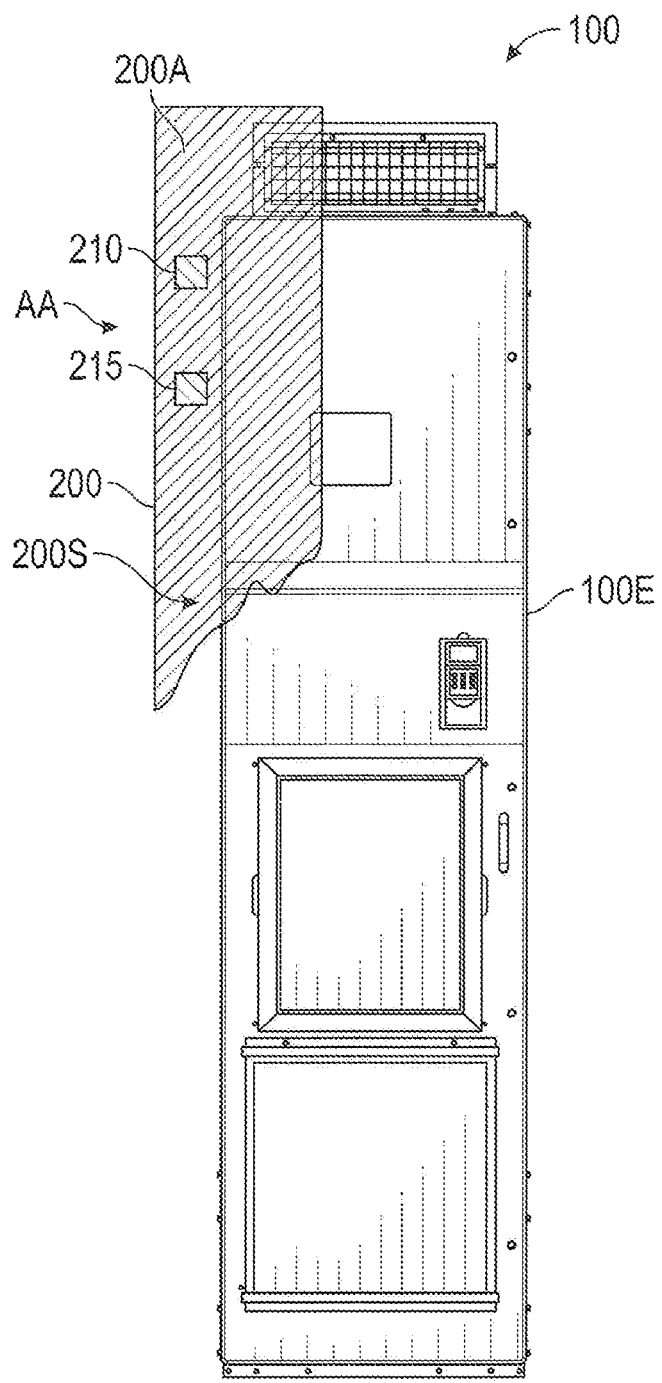
FIG. 1 illustrates one example of an electrical motor drive or bus supply power conversion system (a "motor drive" or "bus supply") and partially illustrates an external corrosion resistant film packaging.
Figure 2:
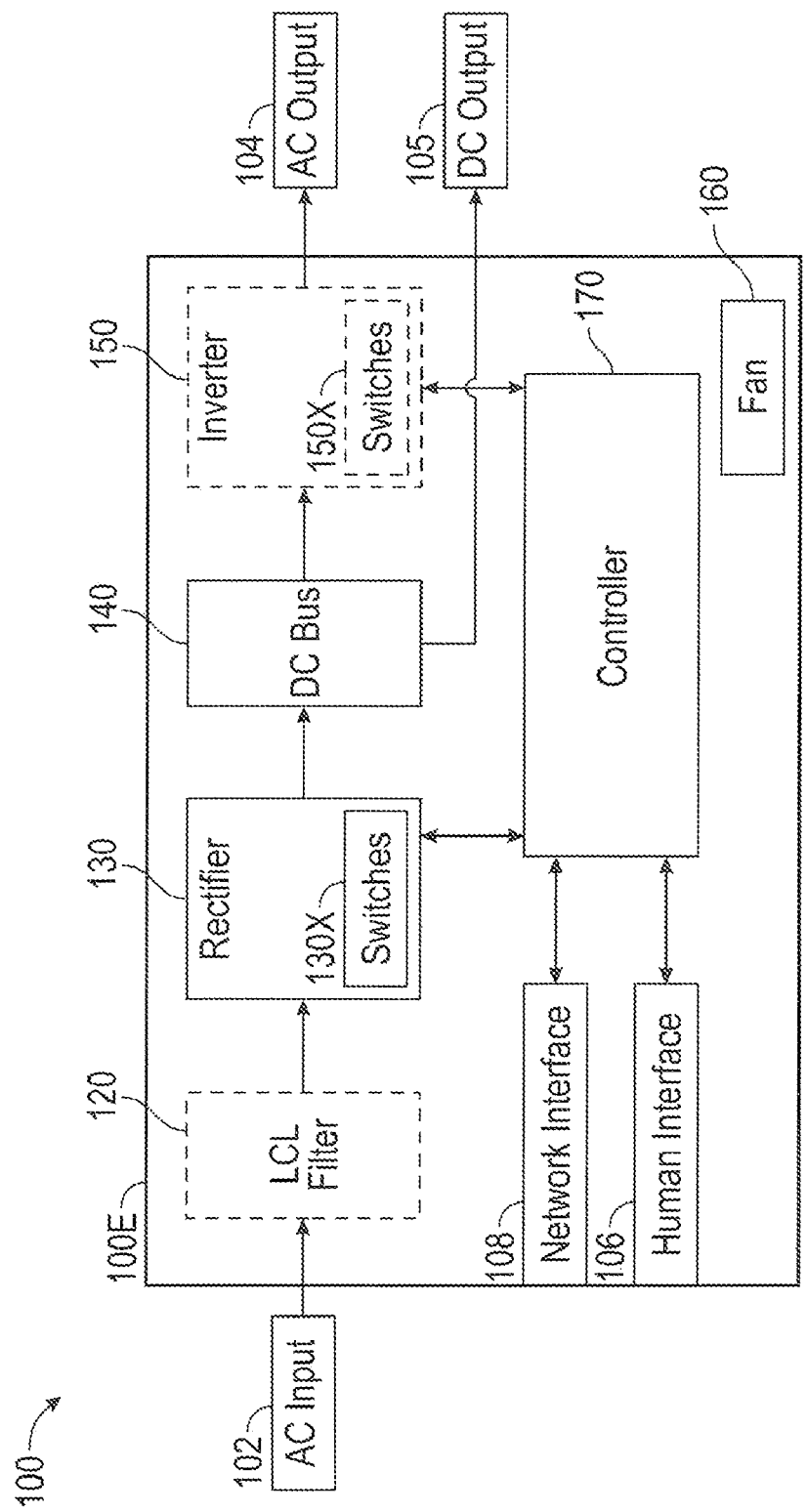
FIG. 2 is a block diagram of a power conversion system such as the system of FIG. 1.

FIGS. 1 & 2 illustrate one example of an electrical motor drive or bus supply power conversion system 100 (sometimes referred to as a "motor drive" or "bus supply") for converting input electrical power such as single or multi-phase AC power from a grid or other source 102 into output electrical power 104 for a motor or other load such that the output power has the required voltage, current, frequency, and/or phase to drive the load at the desired effect. The power conversion system 100 is housed within a sheet metal or other enclosure 100E that contains multiple printed circuit board assemblies (PCBA) that include the required electrical devices and circuits for operative use of the system 100 as described below.

As shown more particularly in FIG. 2, the power conversion system 100 includes a rectifier 130 connected to a DC bus circuit 140. The rectifier 130 includes multiple rectifier switches 130x for rectifying the AC input power 102 and supplying same to the DC bus 140. A power conditioning circuit such as an LCL filter circuit 120 is optionally connected between the input power 102 and the rectifier 130. An inverter 150 may be included and includes multiple inverter switches 150x for inverting the DC bus voltage to a desired AC output power 104. Alternatively, the inverter 150 is omitted such that the DC bus provides DC output power 105 as a bus supply. The rectifier switches 130x and the inverter switches 150x can each be insulated gate bipolar transistor (IGBT) devices or any other suitable semiconductor switches. One or more fans 160 are provided inside or external to the enclosure 100E for circulating air inside the enclosure 100E for cooling the switches 130x,150x and other electrical components of the system 100.

The power conversion system 100 further comprises a control system 170 including one or more microprocessors, microcontrollers, storage devices, random access memory devices, input/output devices and the like as required for the control system 170 to control the switches 130x,150x and all other components of the system 100 based upon executed software, firmware, logic and other control instructions and also based upon feedback signals received from the voltage or current of the output power 104, from the motor or other load being driven, or from other sources. The control system 170 is also connected to one or more Human/Machine Interface devices 106 such one or more keyboards, visual display screens, audio devices, touch screens, or other human input/output devices. The control system 170 is also connected to one or more wired or wireless network interface devices 108 such as network ports, fiber optic transceivers, wireless transceivers, and the like for transmitting data to and receiving data from one or more connected systems.

The power conversion system 100 provided in accordance with an embodiment of the present development includes at least one and preferably multiple anti-corrosion features described below to protect the system 100 from corrosion and other harmful effects caused by an ambient atmosphere that includes corrosive compounds and other contaminants.

Referring again to FIG. 1, according to a first aspect of the present development, the system 100 including its enclosure 100E is completely wrapped and enclosed within in a protective flexible moisture and chemical resistant packaging film 200 (only partially shown) that protects the system 100 against corrosion caused by atmospheric contaminants during shipping and storage between its final assembly and its operative use. The protective film 200 is removed prior to operative use of the motor drive. More particularly, after the system 100 is finally assembled, the moisture and chemical resistant film 200 is used to completely cover all external surfaces of the system 100 such that the installed protective film 200 defines a sealed or closed internal space 200S that contains the system 100 and that includes an internal atmosphere 200A that is separated from an ambient atmosphere AA located outside of the internal space 200S. The film 200 can be provided in the form of a bag or sack that entirely contains the system 100/motor drive enclosure 100E when closed/sealed. Alternatively, the film 200 can be provided in the form of a shrink-wrap or similar tightly wrapped flexible film that is wrapped around and covers all external surfaces of the enclosure 100E. In one example, the film 200 comprises a polymer substrate including particles comprising copper bonded in the polymer substrate. The polymer substrate can comprise any suitable packaging film polymer such as low-density polyethylene, high-density polyethylene, polypropylene, polystyrene, or another polymeric substrate. When the ambient atmosphere AA migrates through the film 200, copper particles carried by the film substrate react with corrosive compounds contained in the ambient atmosphere such as salts, sulfur compounds, ozone, chlorine, nitrous oxides and other "corrosive gases" to neutralize the corrosive compounds before the migrating atmosphere enters the internal atmosphere defined by the protective film 200. The corrosive effects of the moisture and gases that migrate through the film 200 into the internal space 200S are thus greatly reduced or eliminated to protect the system 100 and its components from corrosion and contamination. Optionally, the system 100, when encased in the film 200 for shipping, transport, and storage, further comprises within the internal space 200S defined by the film 200: (i) a package or container of silica gel or another desiccant 210 that absorbs moisture; and/or (ii) a volatile corrosion inhibitor (VCI) emission device 215 that emits a corrosion preventative compound that fills the internal space 200S and coats all surfaces located therein. The film 200, desiccant 210, and VCI device 215 are removed prior to operative use of the system 100. One suitable film 200 is available commercially from Intercept Technology GmbH, Eisenach Germany under the registered trademark INTERCEPT.

Figure 3:
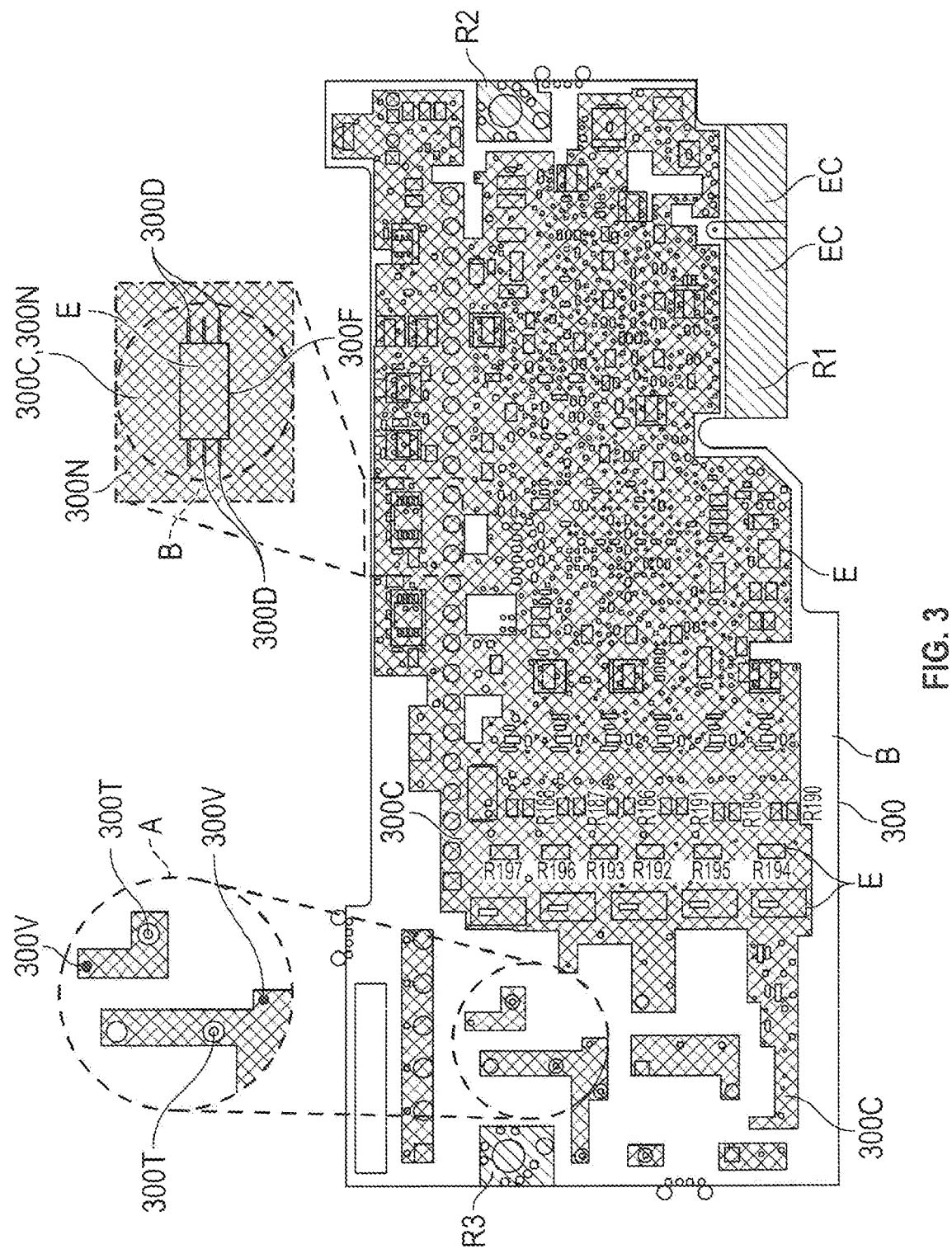
FIG. 3 illustrates a printed circuit board assembly of the system of FIG. 1 including a conformal coating in accordance with an embodiment of the present development.

As shown in FIG. 3, the system 100 contains one or more printed circuit board assemblies (PBCA) 300 within the enclosure 100E. Each PCBA 300 comprises a circuit board B and multiple electronic devices E operably secured to the circuit board B including the above-described switches 130x,150x, components of the control system 170, components of the network interface 108, components of the human machine interface 106, and/or other electronic devices. According to an embodiment of the present disclosure, one or more of the PCBA 300 of the system 100, and preferably every PCBA 300 of the system 100, includes an enhanced conformal coating 300C to protect the electronic components E and other parts of the PCBA from corrosion and other damage caused by an ambient atmosphere AA that includes corrosive vapors or particulates and/or other contaminants. The PCBA 300 comprises one or more keep out regions R1,R2,R3 such as the edge connectors EC and other regions where the conformal coating 300C is omitted. Otherwise, it is most preferred that every exposed metal structure of the PCBA include the conformal coating 300C thereon. In one embodiment, the conformal coating 300C is a ultra-violet light (UV) cured polymer coating that is spray applied and cured on to all electronic devices E and all exposed metal structures such as lead frames of the PCBA except for electronic devices and metal structures located in the keep out regions R1-R3. In one non-limiting example, the conformal coating 300C comprises a UV cured acrylated polyurethane conformal coating, but other polymeric coatings can alternatively be used. In another embodiment, the conformal coating 300C comprises a nanocoating such as a C6 fluorocarbon nanocoating, one example of which is available commercially from Drywired, LLC under the registered trademark DRYWIRED® as product code 101X. In another embodiment, the conformal coating 300C comprises a base conformal coating such as a UV cured acrylated polyurethane or the like, and further includes one or more "spot" or local regions that further comprise an additional coating layer of the same material or a different coating material such as the above-described nanocoating or another nanocoating. As shown in Detail A, the PCBA 300 also includes one or more vias 300V and one or more test points 300T. Each via 300V comprises a bore that extends partially or completely through the circuit board B with a conductive metal lining to interconnect traces located in different layers of the circuit board B. The test points 300T each comprise one or more metal contacts that are conductively connected to respective traces of the circuit board B. As such, the metal lining of each via 300V and the metal contacts of each test point 300T are exposed to the ambient atmosphere AA in which the system 100 is located. According to the present development, these exposed metal structures of each via 300V and test point 300T are coated with the conformal coating 300C that is UV cured in place to prevent contact between these exposed metal structures 300V,300T and the corrosive ambient atmosphere AA. Similarly, as shown in Detail B, one or more of the electronic devices E of the PCBA 300 are chips or other devices that include a metal lead frame 300F that includes a plurality of metal leads 300D that are susceptible to corrosion. According to an embodiment of the present development, the lead frame 300F and its leads 300D are coated with the conformal coating 300C that is ultraviolet (UV) cured in place on these structures to inhibit contact between these exposed metal surfaces and the corrosive ambient atmosphere AA. In one embodiment as noted above, each test point 300T, via 300V, and/or each lead frame 300F and its leads 300D comprise a multi-layer protective coating comprising a first layer of a UV cured conformal coating 300C and a second outer layer of a protective coating 300N (FIG. 3) such as a nanocoating such that the PCBA comprises the conformal coating 300C and one or more local regions further comprising a nanocoating or other second protective coating 300N as an outer layer.

Figure 4:
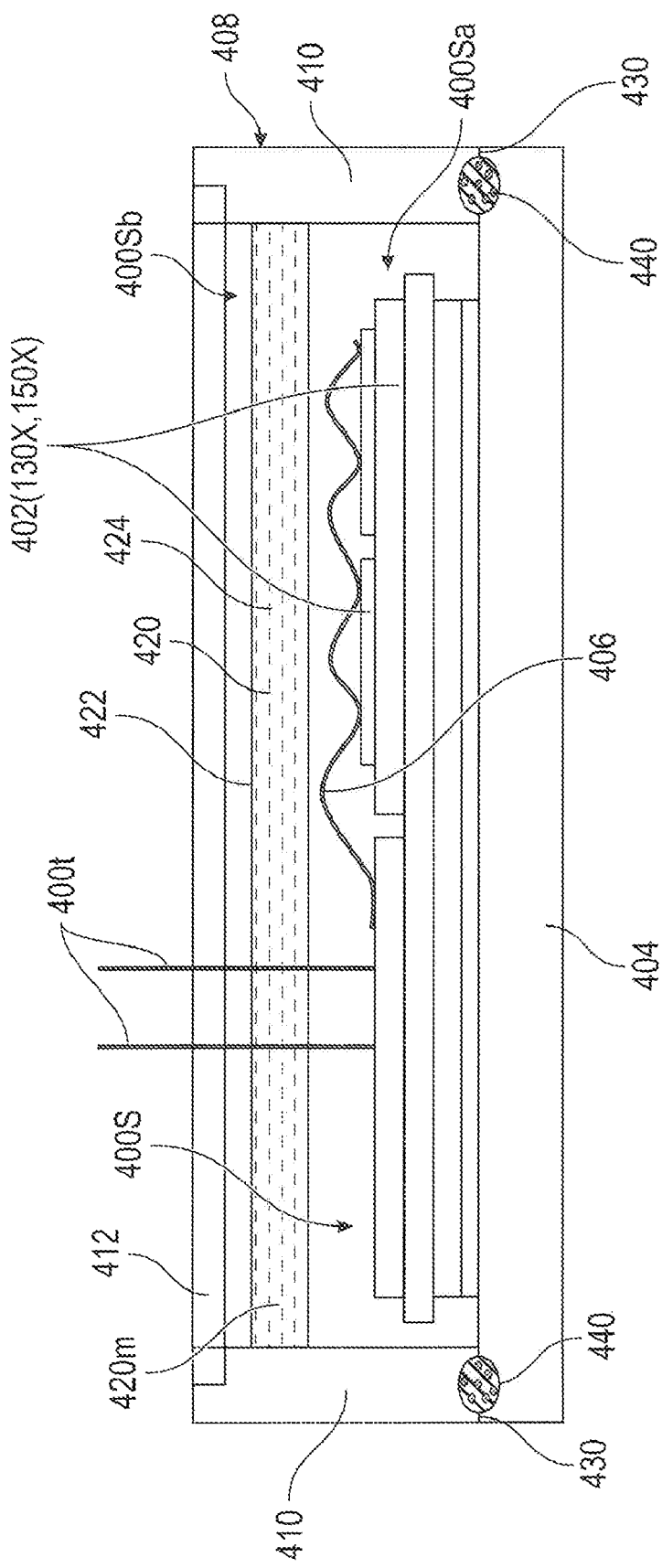
FIG. 4 is a section view of a corrosion resistant switch module for a system provided in accordance with an embodiment of the present development such as the system of FIG. 1.

As noted above, the system 100 comprises a plurality of semiconductor switching devices or switches 130x,150x such as IGBT switches. These and similar switches 130x, 150x have been found to be susceptible to corrosion due to sulfur compounds such as sulfur gas ($S_8$), sulfur dioxide ($SO_2$), hydrogen sulfide ($H_2S$) methanethiol (mercaptan) and other corrosive compounds that are sometimes present in the ambient atmosphere AA. In particular, the sulfur or other corrosive atmosphere AA causes the formation of dendrites such as copper (I) sulfide ($CU_2S$) dendrites that ultimately leads to short circuits and premature failure of the switches 130x,150x. To combat this undesirable outcome, as shown in FIG. 4, the system 100 according to an embodiment of the present development further includes a plurality of corrosion resistant switch modules 400 in which the switches 130x,150x are contained. In one example, the rectifier switches 130x are contained in at least one rectifier switch module 400 (for example three rectifier switch modules 400) and the inverter switches 150x are contained in at least one inverter switch module 400 (for example three inverter switch modules 400). In each switch module 400, one or more semiconductor switches 130x,150x such as the illustrated pair of IGBT switches 402 are supported on a baseplate 404 that includes a conductive metal such as a copper. Multiple bonding wires and other electrical connections 406 are provided between the switches 402 and other structures. A housing 408 such as a polymeric housing includes sidewalls 410 and a top wall 412 and is secured to the baseplate 404. The housing 408 encloses the switches 402 and connections 406 in an internal housing space 400S. First and second leads or terminals 400t are operably connected to the switches 402 and project outwardly through the housing 408 such as through the top wall 412. To minimize or eliminate the corrosive effects of sulfur compounds contained in the ambient atmosphere AA that enters the space 400S, the switch module 400 comprises a protective sacrificial cover layer 420 that extends between the side walls 410 and that completely covers the switches 402 such that the switches 402 are contained in an inner protected sub-space 400Sa defined between the base plate 404 and the protective layer 420. An outer sub-space 400Sb is defined between the protective layer 420 and the top wall 412. The inner sub-space 400Sa is separated from the outer sub-space 400Sb by the protective layer 420. The protective layer 420 comprises a sacrificial anti-corrosion material 420m including a flexible mat or rigid layer of a polymeric or other dielectric substrate 422 in which a powder, granular, or other reactant 424 is dispersed for neutralizing corrosive compounds that permeate from the outer sub-space 400Sb into the inner sub-space 400Sa through the protective layer 420. In one example, the anti-corrosion material from which the protective layer 420 is defined comprises silicone gel or silicone rubber substrate 422 comprising a copper and/or other metallic particles 424 evenly distributed throughout the substrate. Corrosive compounds that permeate the protective layer 420 react with the copper or other metallic particles 424 contained in the protective layer 420 such that a metal sulfide is formed and captured within the protective layer whereby corrosive compounds in the atmosphere that enters the inner sub-space 400Sa through the protective layer 420 are minimized or completely eliminated. The protective layer 420 is sacrificial in that the reactant particles 424 will ultimately be completely reacted at which time they will no longer provide any protective neutralizing function. In some embodiments, the switch module 400 includes one or more seams 430 defined between the wall section 410 and the base plate 404 and/or between sections of the housing 408. In such case, the switch module 400 optionally further comprises a protective seal or gasket 440 defined from a bead of the sacrificial anti-corrosion material 420m located in each seam 430 such that any corrosive atmosphere AA that enters the inner sub-space 400Sa through the seam 430 must permeate through the gasket or seal 440 defined by the anti-corrosion material 420m such that corrosive compounds in the atmosphere are neutralized before entering the inner sub-space 400Sa. In one embodiment, the switch housing 400 is provided as described in published European Patent Application EP 3422399 A1, the entire disclosure of which is hereby expressly incorporated by reference into the present specification.

Figure 5A:
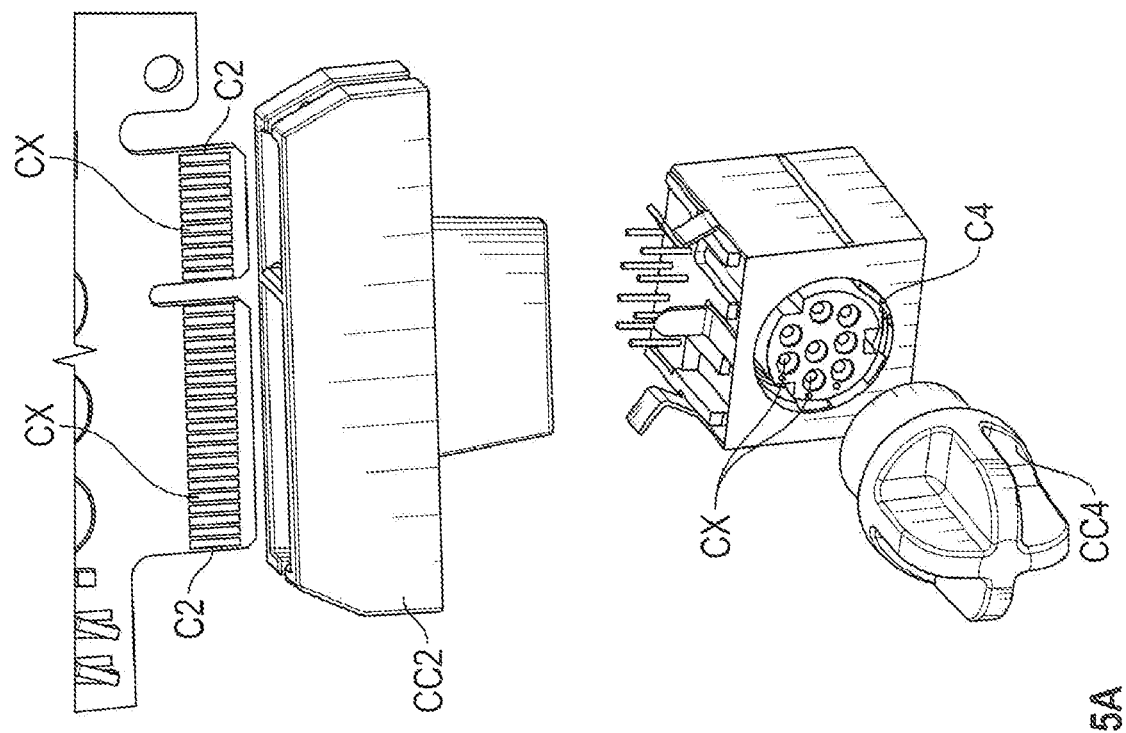
FIGS. 5A & 5B illustrate various embodiments of protective connector covers for preventing connector corrosion inside a motor drive.
Figure 5A:
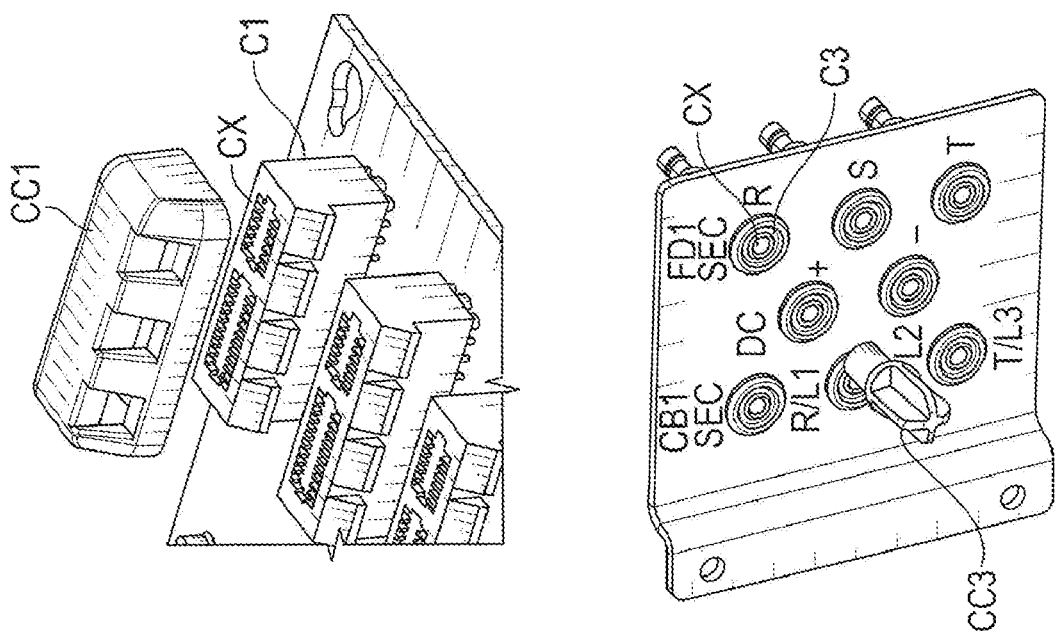
Figure 5B:
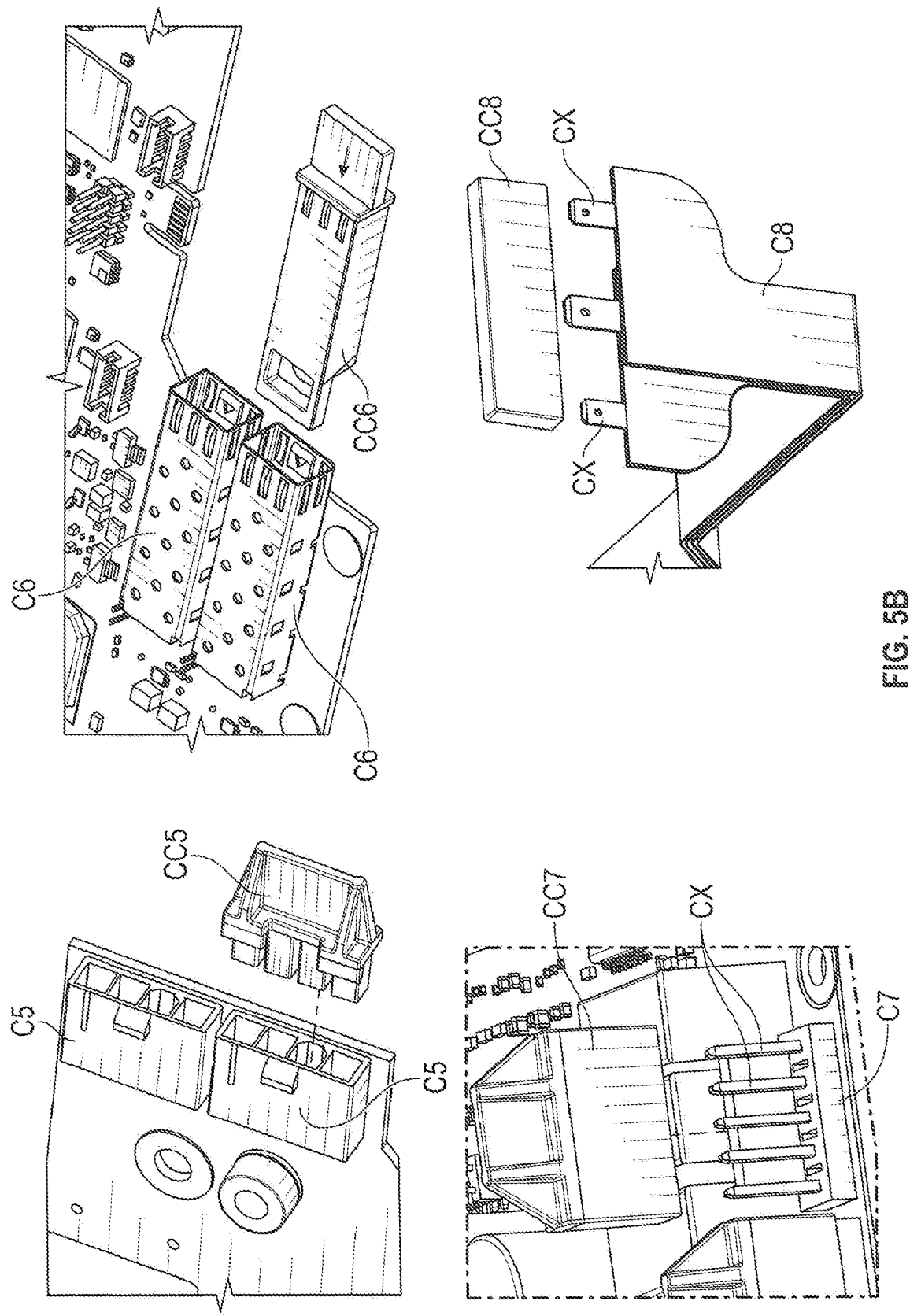

As shown in FIGS. 5A & 5B, the system 100 and the printed circuit board assemblies 300 thereof include multiple different types of electrical connectors C1-C8 inside the enclosure 100E. Non-limiting examples of such connectors are shown in FIGS. 5A & 5B and include PCIE connectors C1, PCBA edge connectors C2, 8-pin or other DIN connectors C3, test point connectors C4, multiple socket connectors C5, fiber optic transceiver connectors C6, multi-pin connectors C7, and single or multi-contact blade connectors C8. Each of the connectors C1-C8 comprise one or more metal contacts CX that are susceptible to corrosion from a corrosive ambient atmosphere when the connector is not operably connected with a mating connector. In many final installations and/or during shipping, handling, and storage, various connectors C1-C8 are unused or "free" and thus are not connected to a corresponding mating connector. According to an embodiment of the present invention, the system 100 comprises a plurality of protective connector covers CC1-CC8 that are respectively mated with unused connectors C1-C8 (each connector cover CC1-CC8 is shown in an exploded view relative to its mating connector C1-C8). The connector covers CC1-CC8 each can comprise a one-piece molded polymeric body that respectively mate with the unused connectors C1-C8 to cover and protect the metal contacts CX of the connectors C1-C8, and the metal contacts CX can optionally be coated with a layer of dielectric grease in additional to be protected by the connector cover CC1-CC8. Accordingly, all unused or "open" connectors of the system 100 are protected from the effects of the corrosive ambient atmosphere AA.

Figure 6:
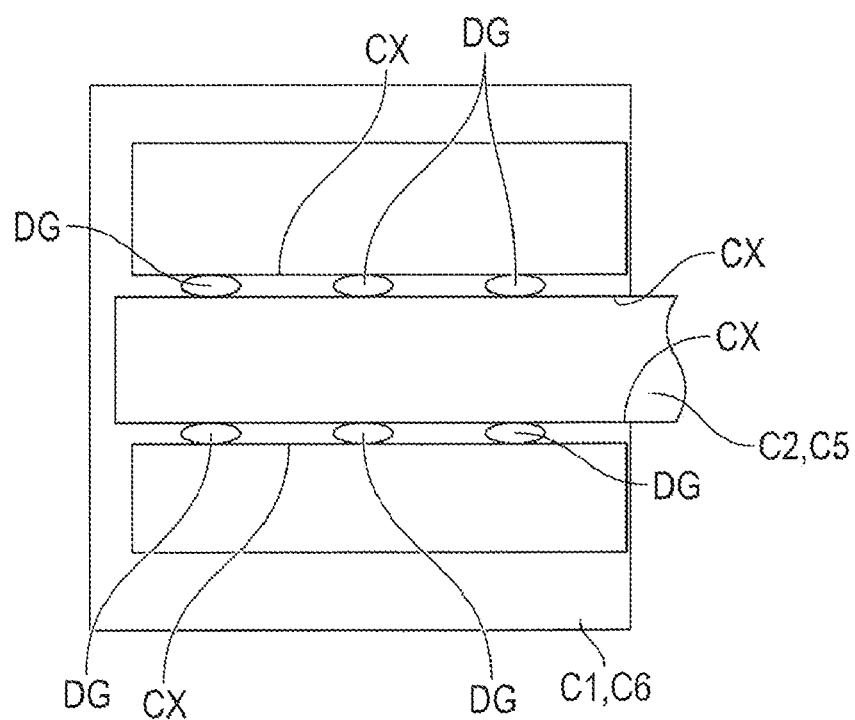
FIG. 6 is a partial section view that illustrates use of dielectric grease to inhibit corrosion of connectors of a power conversion system motor drive.

Referring to FIG. 6, to provide further enhanced protection against corrosive compounds contained in the ambient atmosphere AA, a system 100 provided in accordance with an embodiment of the present development further comprises a dielectric grease coating DG on all metal contacts CX of at least: (i) each PCIE connectors C1 when connected to a corresponding mating connector; (ii) each PCBA edge connector C2 when connected to a corresponding mating connector; and (iii) each fiber optic transceiver connector C6 when mated with a fiber optic transceiver 500 (see FIG. 8). The dielectric grease DG is non-electrically conductive and protects the one or more metal contacts CX of the active connector and the one or more corresponding metal contacts CX of the mated connector from corrosion by sulfur compounds and other corrosive compounds contained in the ambient atmosphere AA. It should be noted that any excessive dielectric grease DG that would inhibit conduction of the electrical signals between the contacts CX is physically wiped or displaced when the contacts CX are mated so that electrical connection is present between adjacent mated contacts CX. According to an embodiment the present development, the contacts of each "active" connected PCIE connector C1, each active connected edge connector C2, and each active connected fiber optic transceiver connector C6 are protected from the corrosive atmosphere AA by a layer of dielectric grease applied to the contacts CX, while the metal contacts CX of each unused connector C1-C8 are protected from the corrosive ambient atmosphere AA by a respective removable connector cover CC1-CC8 as described above in connection with FIGS. 5A & 5B. In one preferred example, the dielectric grease comprises an ultra-violet (UV) tracer material such that the application of the grease DG can be inspected using automated inspection equipment that detects the presence of the UV tracer material.

Figure 7:
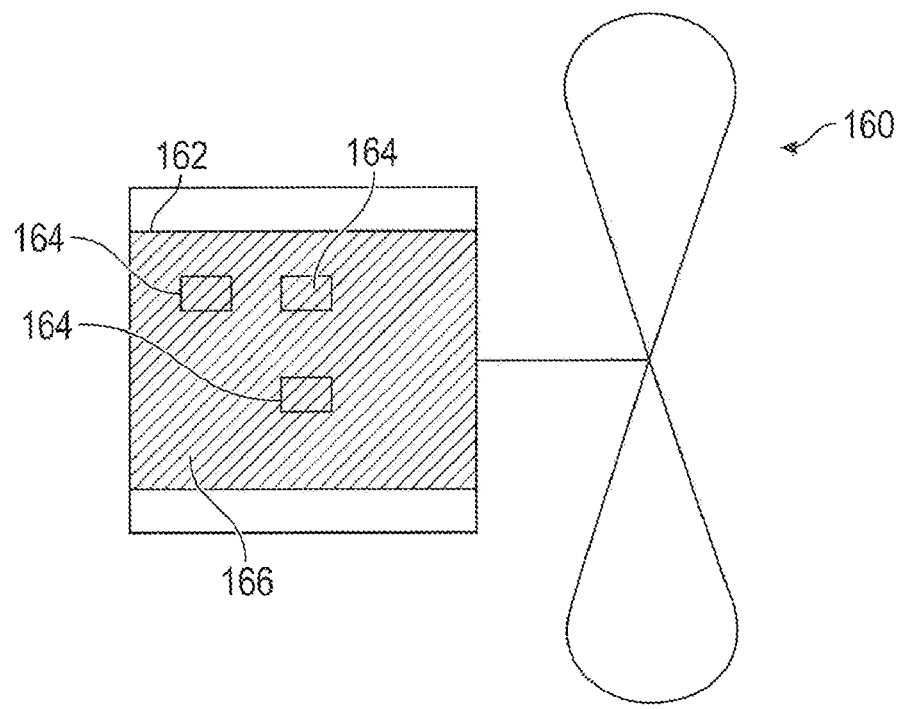
FIG. 7 illustrates a fan of a power conversion system including a conformal coat on its printed circuit board assembly to inhibit corrosion.

As noted above, the system 100 comprises one or more fans 160 provided inside or otherwise in communication with the enclosure 100E for circulating air inside the enclosure 100E for cooling the switches 130x,150x and other electrical components. These fans 160 are susceptible to damage from the corrosive ambient atmosphere AA. Failure of a fan 160 can lead to overheating of other components of the system 100 and can lead to a shutdown. As shown in FIG. 7, each fan comprises a fan PCBA 162 comprising a plurality of fan electrical components 164 that include metal contacts and leads. A primary source of fan failure has been found to be corrosion of the metal contacts and leads of the fan PCBA components 164. Accordingly, a system 100 provided in accordance with an embodiment of the present disclosure includes a fan PCBA 162 coated with a conformal coating 166 such as parylene or a similar conformal coating as indicated by the diagonal line shading in FIG. 7. The conformal coating covers at least all fan electronic components 164 and exposed metal structures on the PCBA 162 and can optionally cover the entire PCBA 162 on both sides. This conformal coating 166 on the fan PCBA 162 inhibits corrosion of the electronic components 164 by reducing or entirely eliminating contact between the corrosive ambient atmosphere AA and the fan electronic components 164 of the fan PCBA 162.

Figure 8:
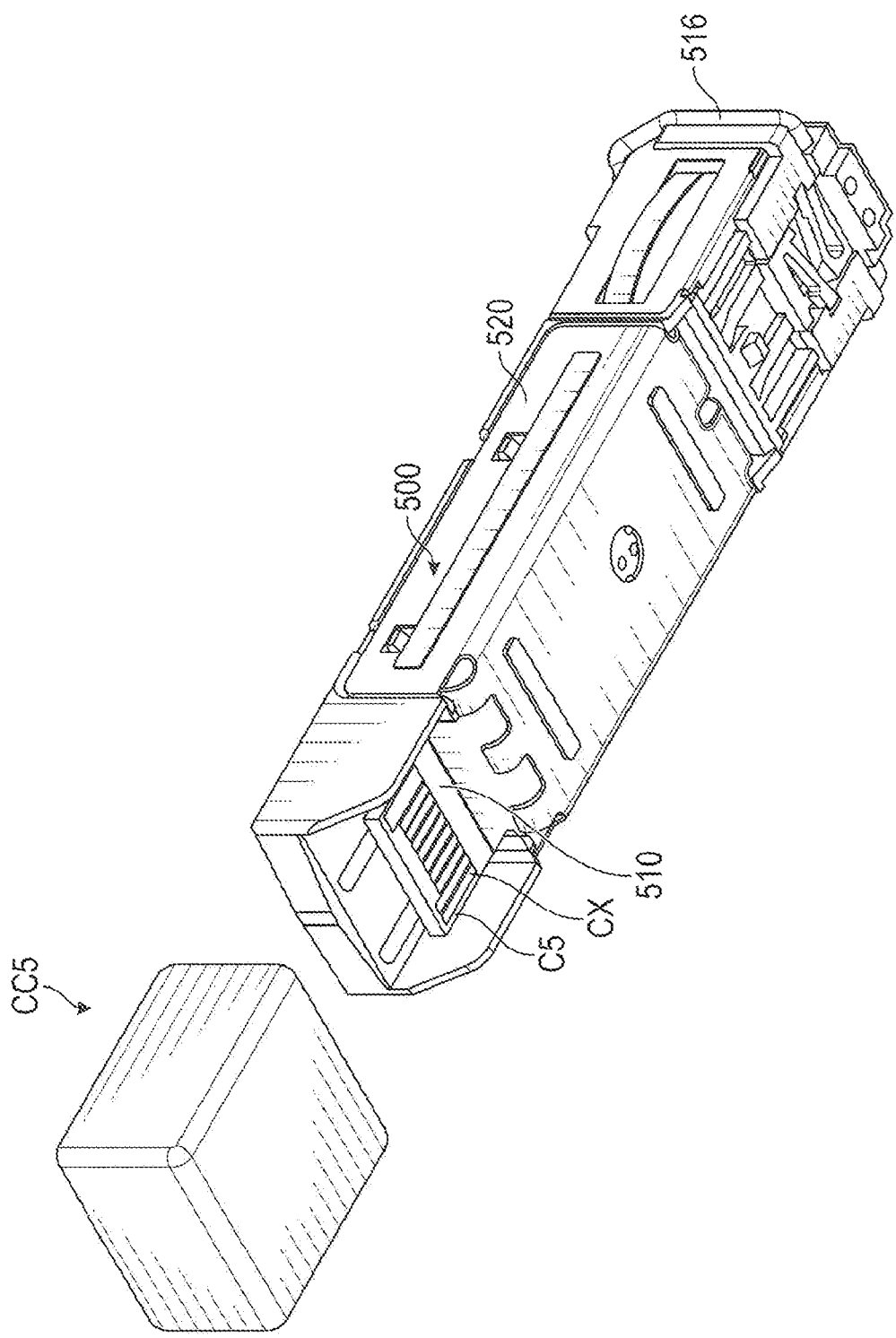
FIG. 8 illustrates a nano-coated fiber optic transceiver for a power conversion system provided in accordance with an embodiment of the present development.

As noted, the system 100 includes one or more fiber optic transceiver connectors C6 as shown in FIGS. 5A & 5B. FIG. 8 illustrates a fiber optic transceiver 500 that is adapted to send optical data signals based upon electrical input data received from a PCBA via connector C6 and that is adapted to transmit electrical output data to the PCBA via connector C6 based upon optical signals received. The fiber optic transceiver 500 includes a PCBA 510 that includes an edge connector C5 that is adapted to mate with the fiber optic transceiver connector C6 shown in FIGS. 5A & 5B. As discussed above, the contacts CX of the edge connector C5 of the fiber optic transceiver 500 are coated with a dielectric grease prior to being mated with the connector C6 to protect the contacts CX of both the connector C6 and the edge connector C5 from corrosion. According to an embodiment of the present disclosure, the entire fiber optic transceiver 500 is coated in a corrosion resistant coating by being dipped in a liquid bath of a coating material that is then baked or otherwise cured on the fiber optic transceiver 500. The contacts CX of the edge connector C5 are covered and protected during the coating process by a coating of dielectric grease or otherwise and are preferably also covered by a removable a connector cover CC5. A transceiver dust cover 516 also remains installed as shown during the coating process. To protect the transceiver 500 from the corrosive atmosphere AA, the entire transceiver 500 is completely dipped in a bath of a nanocoating material such as a hydrophobic and oleophobic C6 fluorocarbon liquid such that the transceiver 500 is internally and externally coated with the nanocoating material on all unprotected internal and external surfaces. After being dipped in such a coating liquid, the transceiver 500 is removed form the bath of coating material and allowed to drain, and the coating is allowed to cure such as by heat such that an ultra-thin layer 520 of conformal coating is included on all exposed internal and external surfaces of the transceiver 500. In this manner all PCBA components and other components inside the transceiver 500 include a protective conformal coating 520 and are thus protected from contact with the corrosive ambient atmosphere AA. One suitable coating material is available commercially from Drywired, LLC under the registered trademark DRYWIRED® as product code 101X.

Drywired 101X is a C6 fluorocarbon nanocoating that forms an ultra-thin conformal coating layer that protect electronics from moisture and corrosion.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A power conversion system comprising:
a rectifier comprising at least one rectifier switch module for rectifying AC input power;
a DC bus connected to the rectifier;
wherein said at least one rectifier switch module comprises:
a base plate;
a housing connected to the base plate and defining an interior space that contains at least one semiconductor switch; and
at least one printed circuit board assembly including a plurality of electronic components, a plurality of vias, and a plurality of test points, wherein said at least one printed circuit board comprises a protective coating comprising at least one of: (i) a conformal coating that covers at least said electronic components, said plurality of vias, and said plurality of test points; and (ii) a nanocoating that covers at least said electronic components, said plurality of vias, and said plurality of test points.

2. The system as set forth in claim 1, wherein said at least one printed circuit board comprises a plurality of unused connectors, wherein each of said unused connectors comprises a removable connector cover mated therewith to protect metal contacts of the unused connector from contact with a corrosive atmosphere.

3. The system as set forth in claim 2, wherein said at least one printed circuit board comprises a plurality of active connectors that are respectively connected to a corresponding mating connector, wherein each active connector comprises one or more metal contacts that are abutted with corresponding metal contacts of the corresponding mating connector, wherein the metal contacts and the corresponding metal contacts are protected from corrosion by a layer of dielectric grease.

4. The system as set forth in claim 3, wherein the dielectric grease comprises a UV tracer material.

5. The system as set forth in claim 1, wherein said at least one printed circuit board comprises a plurality of active connectors that are respectively connected to a corresponding mating connector, wherein each active connector comprises one or more metal contacts that are abutted with corresponding metal contacts of the corresponding mating connector, wherein the metal contacts and the corresponding metal contacts are protected from corrosion by a layer of dielectric grease.

6. The system as set forth in claim 5, wherein the dielectric grease comprises a UV tracer material.

7. The system as set forth in claim 1, further comprising at least one fan that comprises a fan printed circuit board assembly including a plurality of fan electronic devices, wherein said fan printed circuit board assembly comprises the conformal coating that covers at least said fan electronic devices.

8. The system as set forth in claim 7, wherein the conformal coating is a parylene protective coating.

9. The system as set forth in claim 1, wherein said at least one printed circuit board further comprises a fiber optic transceiver, wherein said fiber optic transceiver is coated with the nanocoating that is a protective anti-corrosive nanocoating.

10. The system as set forth in claim 9, wherein the nanocoating comprises a fluorocarbon nanocoating.

11. The system as set forth in claim 1, wherein the conformal coating comprises an ultra-violet light cured polymer.

12. The system as set forth in claim 1, wherein the conformal coating is spray applied and cured on to said electronic components.

13. The system as set forth in claim 1, wherein the protective coating comprises both the conformal coating and the nanocoating.

14. The system as set forth in claim 13, wherein the nanocoating forms an outer layer.

15. The system as set forth in claim 1, further comprising an enclosure that houses said rectifier and said DC bus, wherein said system further comprises a protective film that completely encases said enclosure such that said protective film defines a sealed internal space including said enclosure.

16. The system as set forth in claim 15, wherein said protective film comprises a flexible polymeric substrate and metallic particles contained in said polymeric substrate.

17. The system as set forth in claim 15, further comprising:
a desiccant and a volatile corrosion inhibitor (VCI) emission device located in the internal space defined by the protective film.

18. The system as set forth in claim 1, further comprising:
a protective cover layer comprising a corrosion protection material, said protective cover layer dividing the interior space into an inner sub-space located between the base plate and the protective cover layer and an outer sub-space located between the protective cover layer and the housing;
wherein said at least one semiconductor switch is located in said inner sub-space such that an atmosphere in said outer sub-space passes through the protective cover layer of corrosion protection material before entering said inner sub-space, wherein said corrosion protection material comprises a sacrificial corrosion protection material.

19. The system as set forth in claim 18, wherein the sacrificial corrosion protection material comprises a polymeric substrate including a plurality of reactive metallic particles dispersed throughout said substrate.

20. The system as set forth in claim 19, further comprising:
an inverter connected to the DC bus and comprising at least one inverter switch module for inverting the DC bus voltage to an AC output power, wherein said at least one inverter switch module comprises:
an inverter switch module base plate;
an inverter switch module housing connected to the inverter switch module base plate and defining an inverter switch module interior space that contains at least one inverter semiconductor switch;
an inverter switch module protective cover layer comprising said corrosion protection material, said inverter switch module protective cover layer dividing the interior space of said inverter switch module housing into an inverter switch module inner sub-space located between the inverter switch module base plate and the inverter switch module protective cover layer and an inverter switch module outer sub-space located between the inverter switch module protective cover layer and the inverter switch module housing;

wherein said at least one inverter semiconductor switch is located in said inverter switch module inner sub-space such that an atmosphere in said inverter switch module outer sub-space passes through the inverter switch module protective cover layer of corrosion protection material before entering said inverter switch module inner sub-space;

and wherein said at least one semiconductor switch of said at least one rectifier switch module and said at least one inverter semiconductor switch of said at least one inverter module each comprise an insulated gate bipolar transistor (IGBT).

\* \* \* \* \*